United States Patent [19]
Helm et al.

[11] Patent Number: 6,036,780
[45] Date of Patent: Mar. 14, 2000

[54] MECHANISM FOR DETECTING PARTICULATE FORMATION AND/OR FAILURES IN THE REMOVAL OF GAS FROM A LIQUID

[75] Inventors: John Thomas Helm, Georgetown; Arthur E. Medlin, Austin, both of Tex.

[73] Assignee: Cypress Semiconductor Corporation, San Jose, Calif.

[21] Appl. No.: 08/920,539

[22] Filed: Aug. 27, 1997

[51] Int. Cl.[7] .................................................. C23C 16/00
[52] U.S. Cl. ........................... 118/713; 118/715; 118/719
[58] Field of Search .................................... 118/715, 719, 118/713; 427/8

[56] References Cited

U.S. PATENT DOCUMENTS

| | | | |
|---|---|---|---|
| 5,091,217 | 2/1992 | Hey et al. ............................ | 427/248.1 |
| 5,215,588 | 6/1993 | Rhieu . | |
| 5,401,319 | 3/1995 | Banholzer et al. . | |
| 5,565,058 | 10/1996 | Banholzer et al. . | |
| 5,695,808 | 12/1997 | Cueli .......................................... | 427/9 |

OTHER PUBLICATIONS

Ponnekanti et al., "Failure Mechanisms of Anodized Aluminum Parts Used in Chemical Vapor Deposition Chambers," J. Vac. Sci. Technol. A, vol. 14, No. 3, May/Jun. 1996, pp. 1127–1131.

Van Maaren et al., "Excimer Laser Induced Depositio of Tungsten on SIlicon," Applied Surface Science, vol. 38, 1989, pp. 386–396.

Langford et al., "Maintaining WIndow Transparency in Photo–CVD: A Simultaneous Etch/Deposition Method," IEEE, 1987, pp. 573–576.

*Primary Examiner*—Fred J. Parker
*Attorney, Agent, or Firm*—Kevin L. Daffer; Conley, Rose & Tayon

[57] ABSTRACT

A fluid delivery system is provided having a degas module which can be retrofitted to allow early detection of degas defects within the system. A degas chamber is modifiable to include at least one view port into which an operator can visually examine leaks within a fluid-carrying tube existing exclusively within the degas chamber. Liquid leaking from the tube, or particles possibly entering the tube, can be readily detected through the view port prior to harming any downstream processing operations. In addition to the view port, a purge port can be provided through which a purge gas is transmitted during times when potential backstreaming can occur. The purge gas alleviates unwanted gases from interacting with the volatile leaking liquid. This helps minimize particulate formation in or around the leak and, specifically, particulates entrained within the liquid forwarded to the downstream processing tool. Accordingly, the fluid delivery system is one which can readily detect and therefore prevent unwanted particles from traveling to a processing tool which relies upon pure liquid delivery.

20 Claims, 2 Drawing Sheets

MECHANISM FOR DETECTING PARTICULATE FORMATION AND/OR FAILURES IN THE REMOVAL OF GAS FROM A LIQUID

BACKGROUND OF THE INVENTION

1. Field of the Invention

This invention relates to a degas chamber useful in semiconductor and/or integrated circuit fabrication and, more particularly, to an improved mechanism for protecting and controlling failures in the degas operation.

2. Description of the Related Art

Numerous items can be manufactured from fluid consistently delivered to a reactor or processing tool. Manufacture takes place by loading the item into the processing tool and delivering a vaporized fluid above the item to accumulate a reactive species upon the item. Multiple deliveries of fluid will eventually produce a finalized item or product.

In order to form a consistent product, it is oftentimes beneficial that only fluid be delivered to the processing tool. If the fluid contains solid particles or gas bubbles, problems may arise. Unfortunately, the fluid delivery system in many instances might employ a gas motive force. For example, gas delivered under pressure to a chamber may force fluid within that chamber through a conduit into the processing tool. As gas drives liquid through the conduit, gas bubbles may become entrained within the liquid, and the combination of gas and liquid are deleteriously placed into the processing tool.

In an effort to deliver only liquid to the processing tool, a degas module is often placed between the liquid-driving mechanism (i.e., a mechanism which uses a gas motive force) and the processing tool. The degas module functions to remove gas bubbles or unwanted gaseous molecules from the liquid conduit prior to it entering the processing tool.

A degas module generally comprises a gas permeable conduit extending throughout a degas chamber. The gas-entrained liquid passes into the permeable conduit and, as the liquid passes across the conduit, gas is expelled through the conduit and into the chamber. A vacuum source is coupled in communication with the chamber to suction gas from the conduit into the chamber.

Oftentimes the permeable conduit will suffer a tear or leak, or the bushings around the conduit entering the chamber or exiting the chamber will leak. When this occurs, the volatile liquid within the conduit may transform to a solid state (e.g., crystallize) when exposed to a reacting gas. The reacting gas is generally a gas dissimilar from the motive gas, and can arrive through leaks within the chamber to the outside ambient, or from backstreaming into the chamber from the vacuum port.

A leak within the gas permeable membrane may allow more than gas bubbles or molecules to pass. The leak, if significant, may allow liquid to spill into the degas chamber or particles, which arise as a result of liquid inside the chamber, to form within the chamber and pass into the conduit. Particles placed into the liquid (or gas bubbles remaining in the liquid), and passage of the particles and/or gas into the downstream processing tool deleteriously affect the resulting product.

It is desirable to produce a degas module which can allow an operator to quickly and easily detect any and all leaks within the degas chamber and/or the gas permeable conduit. More importantly, the desirous degas module must be one which does not require disassembly of the module to determine those leaks. Disassembling the module may not uncover a leak within the module but, unfortunately, may cause a leak either during disassembly or during re-assembly. The gas permeable conduit, and bushings surrounding the conduit as they are fed into a degas module are somewhat delicate and fragile. Any movement of those items during disassembly may jeopardize their integrity and may therefore cause leaks which previously did not exist. Accordingly, an improved degas module must be derived which can be easily checked or "debugged" in a less invasive manner.

SUMMARY OF THE INVENTION

The problems outlined above are in large part solved by an improved degas module hereof. The improved degas module is one which does not require disassembly in order to examine the internal components of that module. Therefore, determination of a leak within the gas permeable conduit beneficially occurs by visually inspecting the conduit and the inside of the chamber during operation. Accordingly, the present degas module comprises a viewing port extending into the degas chamber. The viewing port is transparent and allows an operator to visually inspect for leaks.

If a leak occurs, then the liquid traveling through the tube will traverse the leak and accumulate within the chamber. Liquid accumulation can then be visually determined via the view port. The leaked liquid may be volatile when exposed to a reactive gas entering the chamber through the conduit bushing or through backstreaming. Such exposure may form particulates within the liquid on the outer and inner surfaces of the tube adjacent the leak area. Those particulates can be detected with the view port placed in a line of sight between the operator and the gas permeable tube. When peering through the view port mounted through the degas chamber wall, an operator may detect particles or crystalline material forming on the outer surface of the gas permeable tube possibly near the leak area.

If left unattended, particulates developing near the leak will travel with the liquid toward the downstream processing tool. Those particulates may, unfortunately, plug a nozzle possibly used to vaporize the liquid into the processing tool. If the particulates are small enough they may pass into the processing tool and hinder the finalized product. Along with the particulate matter, gas bubbles or gas molecules may also enter the processing tool. The combination of solid and gaseous material may cause uneven delivery of liquid into the processing tool or hinder reaction within the tool in or around the foreign (solid/gas) matter.

Merely as an example of one application, the processing tool may be used to fabricate a semiconductor and/or integrated circuit (henceforth "semiconductor device"). Semiconductor device fabrication generally entails multiple processing steps carried out in a processing tool into which a liquid is delivered. For example, a wet etch, plasma etch or various deposition cycles require delivery of a vaporized liquid into a reaction chamber. Through pyrolytic or plasma inducement, the exposed surface of the semiconductor device can be etched or material can be deposited. To ensure even etch and/or deposition, vaporized liquid must be uniform and even throughout the processing tool. This ensures the vaporized material, or plasma derived from the vaporized material, reacts evenly across the semiconductor surface. If the delivery conduit contains gas and/or solid material, uneven flow may occur or, worse yet, the delivery mechanism may clog or plug.

A popular technique for forming fairly conformal dielectric material on the semiconductor device involves tetraethoxysilane ("TEOS"). For example, TEOS can be applied as a liquid vapor forwarded into a deposition processing tool. TEOS can be forced into the processing tool using an inert gas such as helium as the motive gas. Helium, however, must be removed prior to it entering the processing tool, and such removal is typically carried out in a degas module. An unfortunate aspect of TEOS is that it can be quite volatile. For example, if TEOS is exposed to oxygen, powder or crystalline structures can form. Thus, any leak within the gas permeable tube and backstreaming into the degas module through the vacuum port will cause powder to form upon and within the gas permeable tube. The powder will transfer with the TEOS fluid into the processing tool. Presence of such powder will negatively affect the uniformity by which the dielectric is deposited across the semiconductor surface. Periodic pinholes or voids may form within the dielectric wherever the solid material contacts the surface.

Whenever vacuum to the degas chamber is terminated or temporarily interrupted, a purge cycle is initiated. When the vacuum is relieved, instead of backstreaming materials into the degas chamber through the vacuum port, a purge gas is introduced through an inlet port and forced out the vacuum port. The flow of purge gas prevents backstreaming flow which might react with liquid leaking from the gas permeable membrane. The gas permeable membrane allows gas entrained within the liquid to expel from the tube to a point outside the tube but does not allow purge gas to enter through the gas permeable membrane unless a leak exists. Thus, pores within the membrane allow gases to pass in only one direction, or may be sized to allow molecules of certain gases to pass but not molecules of all gases. The gas permeable membrane is therefore "flow selective" or "gas selective". The present degas module can detect early signs of leaks by allowing an operator to visually inspect powder forming upon the gas permeable tube during operation.

Broadly speaking the present invention concerns a degas chamber. The chamber comprises a tube extending through the chamber and having a section of the tube adapted to expel gas molecules, during use, from the tube into the chamber. A transparent member is configured within a view port or opening, arranged through a wall of the chamber.

The present invention further concerns a system for fabricating a semiconductor wafer. The system comprises a container embodying a deposition source material in liquid form. The system further comprises a processing tool for converting the source material to a vapor and for depositing the vaporized source material upon a semiconductor wafer, either directly or indirectly. A tube extends between the container and the processing tool. A section of the tube is contained within a visually transparent chamber for detecting ingress of undesired gas into the tube from the chamber. The undesired gas is gas which can react with the liquid to form localized areas of solid material. The undesired gas is not the same as the motive gas used to drive the liquid from the container into the processing tool. Undesired gas is therefore gas arriving into the chamber from an ambient surrounding the chamber or from various other processing tools, for example, linked to the degas module via the vacuum port.

BRIEF DESCRIPTION OF THE DRAWINGS

Other objects and advantages of the invention will become apparent upon reading the following detailed description and upon reference to the accompanying drawings in which.

Figure 1:
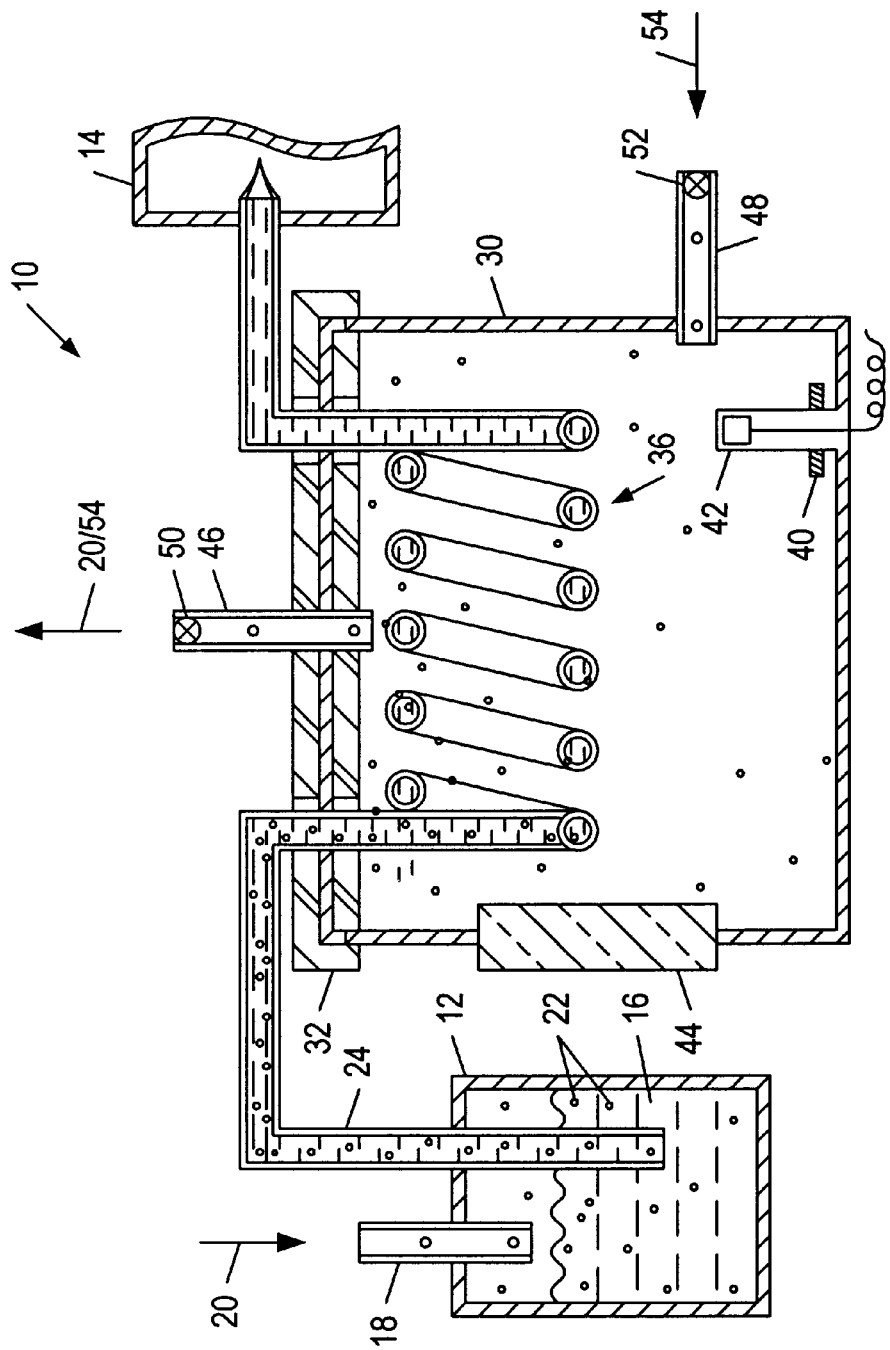
FIG. 1 is a cross-sectional view of a fluid delivery system according to an embodiment of the present invention.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a system 10 for delivering fluid from a fluid-filled container 12 to a processing tool 14. Fluid 16 within container 12 is deemed any fluid which can catalyze a reaction upon a device placed within processing tool 14. According to one example, fluid 16 comprises TEOS used for depositing a dielectric upon a semiconductor device within tool 14. Fluid 16 is placed into and maintained at a relatively constant level within container 12. Inserted into container 12 is an inlet port 18 through which a motive gas 20 is inserted. Motive gas 20 comprises a plurality of gas molecules which push downward upon liquid 16 and, in the process, become entrained as molecules or bubbles 22 with liquid 16. In addition to inlet port 18 is an outlet port 24 spaced from the inlet port. While inlet port terminates above liquid 16, outlet port 24 terminates within liquid 16. Outlet port 24 receives the gas-driven liquid and gas molecules entrained within the liquid.

According to one exemplary embodiment, outlet port 24 comprises a tube having an inside diameter of approximately ⅛ inch. The tube can be made of, for example, stainless steel. When motive gas 20 is driven at a pressure between, for example, 5 to 20 psi, a ⅛ inch tube will transport fluid at the rate of approximately 1800 μL per minute. Tube 24 comprises two opposing ends; one end is placed within container 12 while the other end is placed within processing tool 14. Of course, various linkages may be used to formulate the two opposing ends. Those linkages may be assembled anywhere along the tube length, if desired. Tube 24 extends into and out of a degas module or chamber 30. Chamber 30 includes a lid having various fittings, bushings, o-rings,-etc. possibly arranged within lid 32. Lid 32 can therefore be configured to sealingly receive two portions of tube 24 spaced from one another. Lid 32 can be sealingly placed over, or withdrawn from, an upper lip of chamber 30. When withdrawn, container 30 can be separated from, for example, a coiled portion 36 of tube 24. Thus, according to one example, tube 24 can be coiled in a select region to provide greater mass transfer. However, it is understood that a coil can be arranged in numerous configurations or, in the extreme, need not exist in order to provide sufficient transport.

Portion 36 comprises a section of tube 24 having a gas permeable tube wall. The tube wall (or membrane) allows gas molecules less than a specific atomic size to pass. All other gas molecules cannot pass. The intent of the gas permeable membrane is to allow motive gas 20 to pass from the tube into chamber 30. Accordingly, the motive gas is selected having a relatively small atomic mass. A suitable motive gas may be, for example, helium having an atomic mass of 4.00260. The gas permeable membrane can be made of any substance which either allows one-directional passage of gas molecules, or passage of molecules which are less than a certain size. The gas permeable membrane may prevent reverse gas flow or passage of gas molecules greater than a certain size exceeding, e.g., helium. The form and function of various gas permeable membranes which perform such a function are generally known.

Similar to the inlet port which receives tube 24 from container 12, an outlet port receives the outlet portion of tube 24 directed to tool 14. The gas-entrained molecules within the relatively slow flowing liquid pass from the gas permeable section 36 into chamber 30 prior to entering the outlet portion of tube 24. Accordingly, the outlet portion indicates liquid only, and not molecules and/or bubbles.

During malfunction, however, gas bubbles and/or molecules may enter the outlet portion of tube 24. One type of malfunction would be a tear or opening which forms a leak within section 36. The opening or tear can present numerous problems. For example, liquid from tube 24 may spill from the opening into chamber 30, causing the chamber to fill with liquid as indicated by a float device 40. Float 40 extends upward along a yoke 42 whenever liquid begins to fill chambers 30. Movement of float 40 relative to yoke 42 will signal fluid within chamber 30. Unfortunately, if gas other than the motive gas 20 enters chamber 30, the gas may react with the volatile liquid to form particles within chamber 30. Those particles will accumulate upon float 40 and not allow movement of the float and therefore will not allow the sensor to indicate the leak. Accordingly, an alternative solution for leak detection is needed. That solution is provided, in part, by a view port 44 extending through a region of chamber 30. Specifically, view port 44 extends through a localized region of a wall which forms chamber 30. View port 40 may be occupied with a removable transparent member, a suitable transparent material being quartz or glass.

View port 44 allows an operator to visually examine the inside components of chamber 30 without having to remove those components from the chamber. Accordingly, view port 44 allows in situ examination, the benefit of which is to avoid moving tube 24 in the gas permeable section 36 whenever inspections are needed. Moreover, view port 44 allows more regular viewing of section 36 to determine if powder, crystalline material, or solid particles form thereon, or accumulate within chamber 30. Thus, view port 44 not only allows visual detection of an opening or tear within section 36, but also allows early detection of particulates forming in or around the opening. Those particulates being particularly damaging to the downstream processing tool 14, as well as items processed therein.

Chamber 30 further comprises a vacuum outlet port 46 and a purge inlet port 48. Vacuum port 46 is connected to a vacuum pump, described below, to extract the motive gas bubbles/and or molecules which traverse section 36. During times when the vacuum pump is inactivated, backstreaming might occur into chamber 30 from the pump source, or various other chambers connected to the pump source. To prevent such backstreaming, a valve 50 is placed upon vacuum outlet port 46. Valve 50 is intended to be shut off to block backstreaming during times when the vacuum pump is inactive. Valve 50, however, may malfunction. As an additional safety measure, purge inlet port 48 is also provided. Thus, if valve 50 is inadvertently not shut off when the pump is inactive, a valve 52 upon port 48 is turned on allowing purge gas 54 to enter chamber 30 and be expelled through the opened valve 50 of vacuum port 46. Accordingly, vacuum port 46 can extract either the motive gas or the purge gas, as shown. An additional benefit in using a purge inlet port 48 is to force any and all solid particles which might form within chamber 30 out vacuum port 46 during times when the degas module is inactive and/or the vacuum pump is inactive. Accordingly, particles can be removed from chamber 30 periodically to prevent buildup upon section 36 and, to some degree, minimize particle movement into processing tool 14. A suitable purge gas comprises any gas having, for example, an atomic mass greater than the motive gas. Accordingly, it is by chosen design that purge gas 54 minimally enter tube 24, if at all. This is due, in part, to the selective nature which section 36 allows certain gas molecules to pass. A suitable purge gas 54 which achieves the aforementioned function is, for example, nitrogen.

Figure 2:
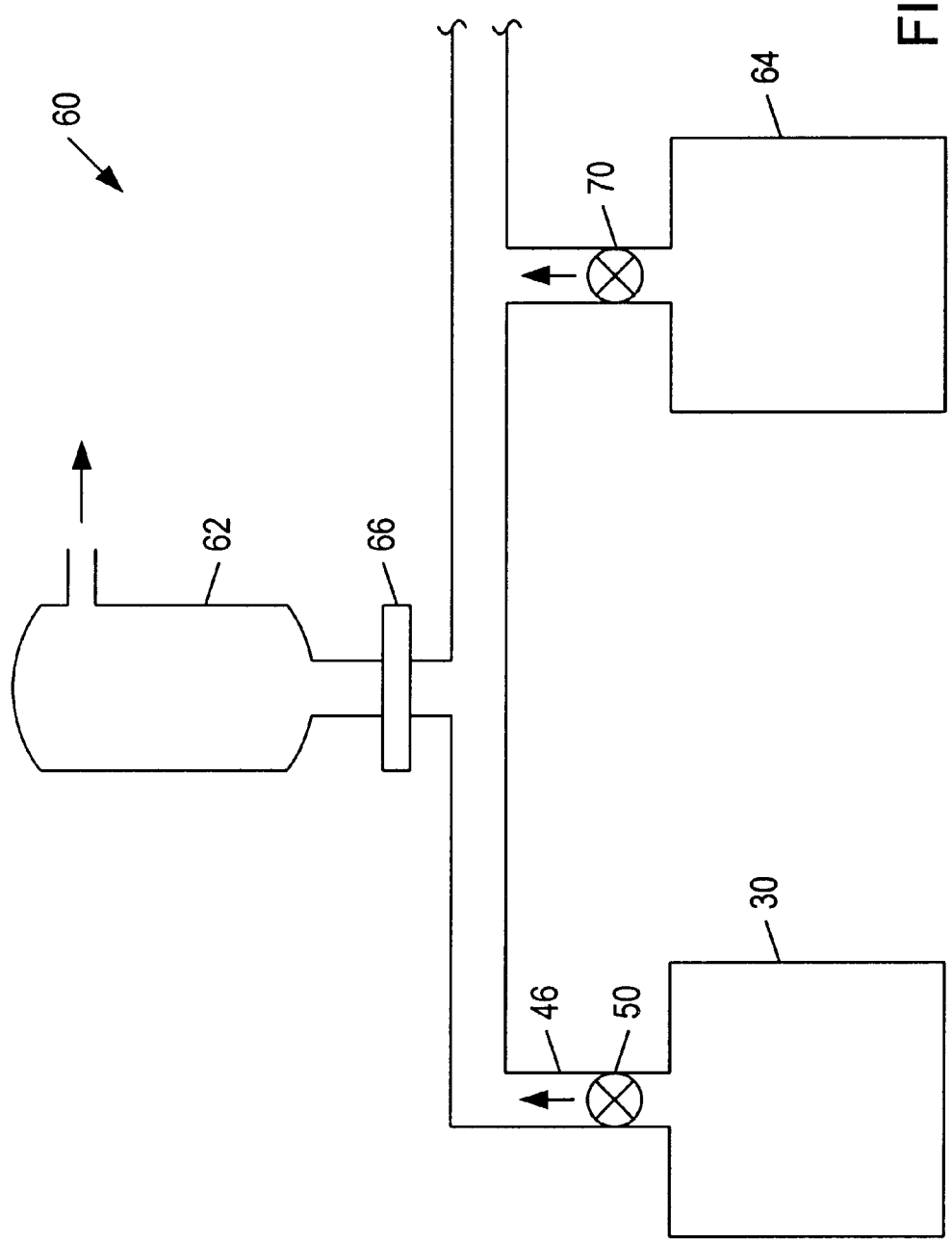
FIG. 2 is a plan view of a vacuum system linking various chambers including those within the fluid delivery system of FIG. 1.

Referring to FIG. 2, a plan view is shown of a vacuum system 60 which couples vacuum port 46 to various other vacuum ports. Vacuum port 46 is shown in gaseous communication between degas chamber 30 and a vacuum pump 62 as well as other chambers 64. When throttle valve 66 is open, vacuum pump 62 extracts motive gas from chamber 30 through vacuum port 46, as well as other gases from other chambers shown as reference numeral 64. Gases within chamber 64 may be dissimilar from the motive gas such that when vacuum pump 62 is off or throttle 66 is closed, backstreaming may occur. Backstreaming is particularly a problem if cut-off valves 50 and 70 are not turned off. For example, if valve 50 is not turned off when vacuum is terminated, backstreaming from various other chambers may enter chamber 30 causing a reaction between the backstreaming gas and liquid leaking into the gas permeable tube. A result of such interaction is generally particulate formation within chamber 30 and, unfortunately, passage of solid particles into a downstream processing tool. Using the present view port will allow early detection of such particulate formation and/or control thereof.

It will be appreciated to those skilled in the art having the benefit of this disclosure that this invention is believed applicable to any system which delivers liquid (absent gas molecules) into a processing tool. Accordingly, the present invention is applicable to fluid delivery to a semiconductor processing tool for removing material from or adding material to a semiconductor device arranged within the processing tool. It is to be understood, however, that the form of the invention shown and described is to be taken as exemplary, presently preferred embodiments applicable to processing tools beyond those used in semiconductor fabrication. Regardless of its application, the present degas chamber is intended to be retrofitted with a view port to allow early detection of degas failure. The material contained within the view port may not only be transparent, but also can be used to magnify or focus a visual view upon components placed interior to the chamber. A light source may be passed into the view port or into another view port arranged upon another region of the chamber. Accordingly, two view ports spaced from one another can be formed within a pre-existing degas chamber. A suitable, retrofittable degas chamber used in semiconductor fabrication can be obtained from, for example, Novellus Corp. A Novellus degas chamber retrofitted with the present view port or view ports, and/or purge inlet port provides substantial improvement in the maintenance of an overall fluid delivery system.

What is claimed is:

1. A chamber, comprising:
   a tube extending through the chamber and having a section of the tube adapted to expel gas molecules, during use, from the tube into the chamber; and
   a transparent member configured within an opening through a wall of the chamber, said tube being viewable through said transparent member to enable detection of visually detectable material in or on said tube.

2. The chamber as recited in claim 1, wherein said transparent member comprises quartz or glass.

3. The chamber as recited in claim 1, wherein said tube extends between opposing walls of said chamber.

4. The chamber as recited in claim 1, wherein said tube comprises a tube wall having a circular cross section, and wherein said tube wall within said section is gas permeable.

5. The chamber as recited in claim 4, wherein said tube wall is liquid impermeable.

6. The chamber as recited in claim 1, further comprising a vacuum port coupled to another opening in said wall for drawing said gas molecules through said section.

7. The chamber as recited in claim 6, further comprising a gas inlet port coupled to yet another opening in said wall for transferring an inert gas into the chamber.

8. The chamber as recited in claim 7, wherein said section is adapted to expel gas molecules having a greater atomic weight than that of said inert gas.

9. The chamber as recited in claim 6, further comprising:
   another visually transparent member configured within another opening through said wall; and
   a light source directed through said another visually transparent member and into said chamber for illuminating said section.

10. A system for fabricating a semiconductor wafer, comprising:
    a container containing a deposition source material in liquid form;
    a processing tool for converting the source material to a vapor and for depositing the vaporized source material upon a semiconductor wafer; and
    a tube extending between the container and the processing tool, a section of which is contained within a visually transparent chamber for detecting visually detectable materials in or on the tube.

11. The system as recited in claim 10, wherein said container is adapted to receive a motive gas to drive said deposition source material through said tube and into said processing tool.

12. The system as recited in claim 10, wherein said section is permeable to said motive gas.

13. The system as recited in claim 10, further comprising a vacuum port placed in gaseous communication within said chamber.

14. The system as recited in claim 13, wherein said tube extends between opposing walls of said chamber.

15. The system as recited in claim 14, wherein said motive gas is expelled from said tube, into said chamber, and out said vacuum port through pores arranged within said section.

16. The system as recited in claim 15, wherein said pores are dimensioned to allow passage of motive gas therethrough.

17. The system as recited in claim 10, further comprising a gas inlet port coupled to forward an inert gas into said chamber.

18. The system as recited in claim 10, wherein said deposition source material within said container comprises tetraethoxysilane (TEOS).

19. The system as recited in claim 10, wherein said processing tool comprises a chemical vapor deposition (CVD) tool.

20. The system as recited in claim 10, wherein said chamber comprises a wall at least partially configured with a transparent member which allows visual communication or light communication with said chamber.

* * * * *